(12) United States Patent
Chen et al.

(10) Patent No.: US 11,253,059 B2
(45) Date of Patent: Feb. 22, 2022

(54) CABINET

(71) Applicant: Wistron NeWeb Corp., Hsinchu (TW)

(72) Inventors: Yan-Da Chen, Hsinchu (TW);
Chien-Ming Peng, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 178 days.

(21) Appl. No.: 16/789,496

(22) Filed: Feb. 13, 2020

(65) Prior Publication Data

US 2021/0022491 A1  Jan. 28, 2021

(30) Foreign Application Priority Data

Jul. 23, 2019  (TW) .................................. 108125953

(51) Int. Cl.
*A47B 46/00* (2006.01)
*H05K 7/14* (2006.01)
*A47B 57/18* (2006.01)
*A47B 88/423* (2017.01)
*H05K 5/02* (2006.01)

(52) U.S. Cl.
CPC .............. *A47B 46/00* (2013.01); *A47B 57/18* (2013.01); *A47B 88/423* (2017.01); *A47B 2210/0059* (2013.01); *H05K 5/0204* (2013.01); *H05K 7/1489* (2013.01)

(58) Field of Classification Search
CPC ....... A47B 46/00; A47B 57/18; A47B 88/423; A47B 2210/0059; H05K 7/183; H05K 7/1491; H05K 5/0204
USPC ................................ 312/334.1, 334.7, 334.8
See application file for complete search history.

(56) References Cited

U.S. PATENT DOCUMENTS

| 4,993,847 | A  | * | 2/1991  | Hobbs   | A47B 88/57  |
|           |    |   |         |         | 312/334.46  |
| 6,402,275 | B1 | * | 6/2002  | Yang    | A47B 88/483 |
|           |    |   |         |         | 312/334.46  |
| 6,926,377 | B2 | * | 8/2005  | Lammens | A47B 88/49  |
|           |    |   |         |         | 312/333     |
| 8,879,271 | B2 | * | 11/2014 | Fan     | H05K 7/1489 |
|           |    |   |         |         | 361/725     |
| 8,967,565 | B2 | * | 3/2015  | Chen    | A47B 88/43  |
|           |    |   |         |         | 248/221.11  |

(Continued)

FOREIGN PATENT DOCUMENTS

| CN | 102883577 A | 1/2013  |
| CN | 104172758 A | 12/2014 |
| CN | 207519020 U | 6/2018  |

*Primary Examiner* — Patrick D Hawn
(74) *Attorney, Agent, or Firm* — McClure, Qualey & Rodack, LLP

(57) ABSTRACT

A cabinet is provided, which is adapted to receive a device. The cabinet includes a plurality of first pillars, a plurality of second pillars, a plurality of track units, and two sliders. Each track unit is bridged between one of the first pillars and one of the second pillars. The sliders are disposed on two sides of the device, wherein the sliders are slidably connected to the track units. Each track unit includes a first connection base and a track portion. The first connection base is disposed on one end of the track portion. The first connection base includes a first connection side, a first base side, and a second base side. The first connection side is located between the first base side and the second base side. The first connection side is connected to the first pillar.

12 Claims, 14 Drawing Sheets

(56) References Cited

U.S. PATENT DOCUMENTS

| | | | | |
|---|---|---|---|---|
| 9,148,976 | B2* | 9/2015 | Fan | H05K 7/1489 |
| 9,480,183 | B2* | 10/2016 | Chen | H05K 7/1489 |
| 9,681,749 | B2* | 6/2017 | Chen | H05K 7/183 |
| 9,693,628 | B2* | 7/2017 | Chen | A47B 88/40 |
| 9,986,830 | B2* | 6/2018 | Chen | A47B 88/75 |
| 10,159,343 | B2* | 12/2018 | Chen | H05K 7/1489 |
| 10,251,482 | B2* | 4/2019 | Chen | A47B 57/545 |
| 10,413,065 | B2* | 9/2019 | Chen | A47B 88/50 |
| 10,555,607 | B2* | 2/2020 | Chen | A47B 88/49 |
| 10,631,638 | B2* | 4/2020 | Chen | A47B 47/0075 |
| 10,791,833 | B2* | 10/2020 | Chen | A47B 88/45 |
| 10,999,950 | B2* | 5/2021 | Lu | H05K 7/183 |
| 2011/0135224 | A1* | 6/2011 | Chen | H05K 7/1489 |
| | | | | 384/26 |
| 2013/0044416 | A1* | 2/2013 | Fan | H05K 7/1489 |
| | | | | 361/679.01 |
| 2018/0098626 | A1* | 4/2018 | Chen | H05K 7/1489 |
| 2018/0125234 | A1* | 5/2018 | Chen | A47B 88/43 |
| 2018/0317652 | A1* | 11/2018 | Chen | A47B 88/407 |
| 2020/0221868 | A1* | 7/2020 | Hsu | A47B 88/43 |
| 2020/0344911 | A1* | 10/2020 | Tower | A47B 88/49 |
| 2021/0148403 | A1* | 5/2021 | Chen | F16C 29/02 |
| 2021/0337695 | A1* | 10/2021 | Chen | A47B 96/07 |

* cited by examiner

CABINET

CROSS REFERENCE TO RELATED APPLICATIONS

This Application claims priority of Taiwan Patent Application No. 108125953, filed on Jul. 23, 2019, the entirety of which is incorporated by reference herein.

BACKGROUND OF THE INVENTION

Field of the Invention

The present invention relates to a cabinet, and in particular to a cabinet capable to receive a plurality of devices.

Description of the Related Art

Conventionally, electronic devices such as switches and servers are stacked in a cabinet. The design of the cabinet is restricted by stander request, and the size thereof cannot be changed. When the electronic device (for example, a switch) is too wide, the electronic device cannot be inserted into the cabinet. The design of the electronic device is restricted. Additionally, electronic devices are tightly stacked in a cabinet. When an electronic device is drawn out from the cabinet independently to be repaired, it can be difficult to reinsert the electronic device into the cabinet.

BRIEF SUMMARY OF THE INVENTION

In one embodiment, a cabinet is provided, which is adapted to receive a device. The cabinet includes a plurality of first pillars, a plurality of second pillars, a plurality of track units and two sliders. Each track unit is bridged between one of the first pillars and one of the second pillars. The sliders are disposed on two sides of the device, wherein the sliders are slidably connected to the track units. Each track unit comprises a first connection base and a track portion, the first connection base is disposed on one end of the track portion, the first connection base comprises a first connection side, a first base side, and a second base side. The first connection side is located between the first base side and the second base side. The first connection side is connected to the first pillar. On a projection of the first connection side, the track portion is located between the first base side and the second base side.

In one embodiment, when the device is received in the cabinet, the first base side faces the device, and the second base side is opposite the first base side.

In one embodiment, the track portion comprises a plurality of enhancement ribs, and the enhancement ribs are parallel to each other.

In one embodiment, each slider comprises a slider body and an elastic arm, the elastic arm is connected to the slider body, and the elastic arm is adapted to abut the first connection base.

In one embodiment, a first end of the elastic arm is affixed to the slider body, a body slot is formed on the slider body, a second end of the elastic arm is inserted into the body slot, an abutting protrusion is formed on the elastic arm, and the abutting protrusion is adapted to abut the first connection base.

In one embodiment, the elastic arm comprises a first elastic section and a second elastic section, the first elastic section is located between the first end and the abutting protrusion, the second elastic section is located between the second end and the abutting protrusion, and the length of the first elastic section is greater than the length of the second elastic section.

In one embodiment, the ratio of the length of the first elastic section to the length of the second elastic section is between 1~2.33.

In one embodiment, the second elastic section comprises a first bent portion and a second bent portion, the first bent portion is located between the second bent portion and the abutting protrusion, and the second bent portion is located between the first bent portion and the second end.

In one embodiment, the slider body comprises a body opening, and the body opening corresponds to the abutting protrusion.

In one embodiment, the first connection base comprises a first wedging protrusion, the first pillar comprises a plurality of first wedging holes, and the first wedging protrusion is adapted to be wedged into one of the first wedging holes.

In one embodiment, the first connection base is slidably connected to the track portion.

In one embodiment, each track unit comprises a plurality of latches, the first connection base comprises a plurality of base slots, each latch passes through one of the base slots to be affixed to the track portion, and the latches are adapted to abut the first connection base.

In one embodiment, each track unit comprises a track bolt, and the track bolt is affixed to a relative position between the first connection base and the track portion.

In one embodiment, the first connection base comprises a spring and a receiving recess, the spring is disposed in the receiving recess, one end of the spring abuts an inner wall of the receiving recess, the other end of the spring abuts the first wedging protrusion, and the first wedging protrusion is adapted to be moved between a first protrusion position and a second protrusion position.

In one embodiment, the slider comprises a slider bolt, the slider body comprises a body fastening hole, the first wedging protrusion comprises a first protrusion thread hole, the slider bolt passes through the body fastening hole to be connected to the first protrusion thread hole, and the slider bolt affixes the slider body to the first wedging protrusion.

In one embodiment, each track unit further comprises a second connection base, the second connection base is disposed on the other end of the track portion, the second connection base comprises a second wedging protrusion, the second pillar comprises a plurality of second wedging holes, the second wedging protrusion is adapted to be wedged into one of the second wedging holes, the second wedging protrusion comprises a second protrusion thread hole, the cabinet further comprises a management rack and a rack bolt, and the rack bolt is connected to the second protrusion thread hole to affix the management rack to the second wedging protrusion.

In one embodiment, the track portion comprises a first track and a second track. The first track faces the second track. The slider is partially inserted into the first track and the second track. The slider slides along the first track and the second track. On the projection of the first connection side, the first track and the second track are entirely located between the first base side and the second base side.

Utilizing the cabinet of the embodiment of the invention, the track portion is located between the first base side and the second base side on the projection of the first connection side. Therefore, the space between the first pillar and the second pillar can be sufficiently used. The device with increased width can be received between the first pillars and the second pillars. Particularly, the size of the slider of the embodiment of the invention is reduced, and the slider of the embodiment of the invention provides slide track function in limited space. Additionally, in the embodiment of the invention, the wedging protrusion can be moved relative to the track portion. The device can be drawn out from the cabinet independently to be repaired, and be reassembled into the cabinet easily.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
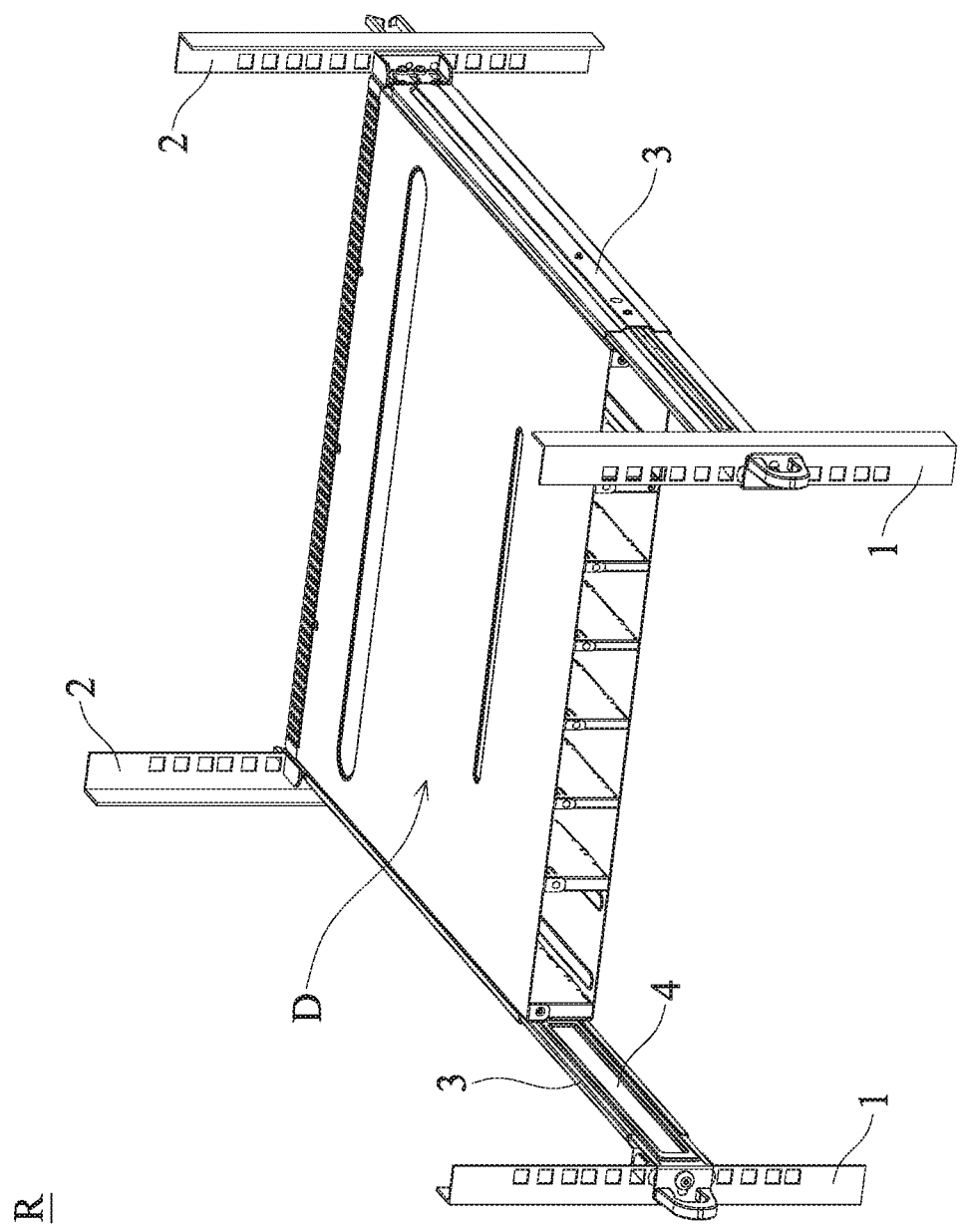
FIG. 1 shows a cabinet of an embodiment of the invention.

FIG. 1 shows a cabinet R of an embodiment of the invention, which is adapted to receive a plurality of devices D. In this embodiment, the devices D can be switches or other electronic devices. With reference to FIG. 1, the cabinet R includes a plurality of first pillars 1, a plurality of second pillars 2, a plurality of track units 3 and two sliders 4. Each track unit 3 is bridged between one of the first pillars 1 and one of the second pillars 2. The sliders 4 are disposed on two sides of the device D. The sliders 4 are slidably connected to the track units 3.

Figure 2:
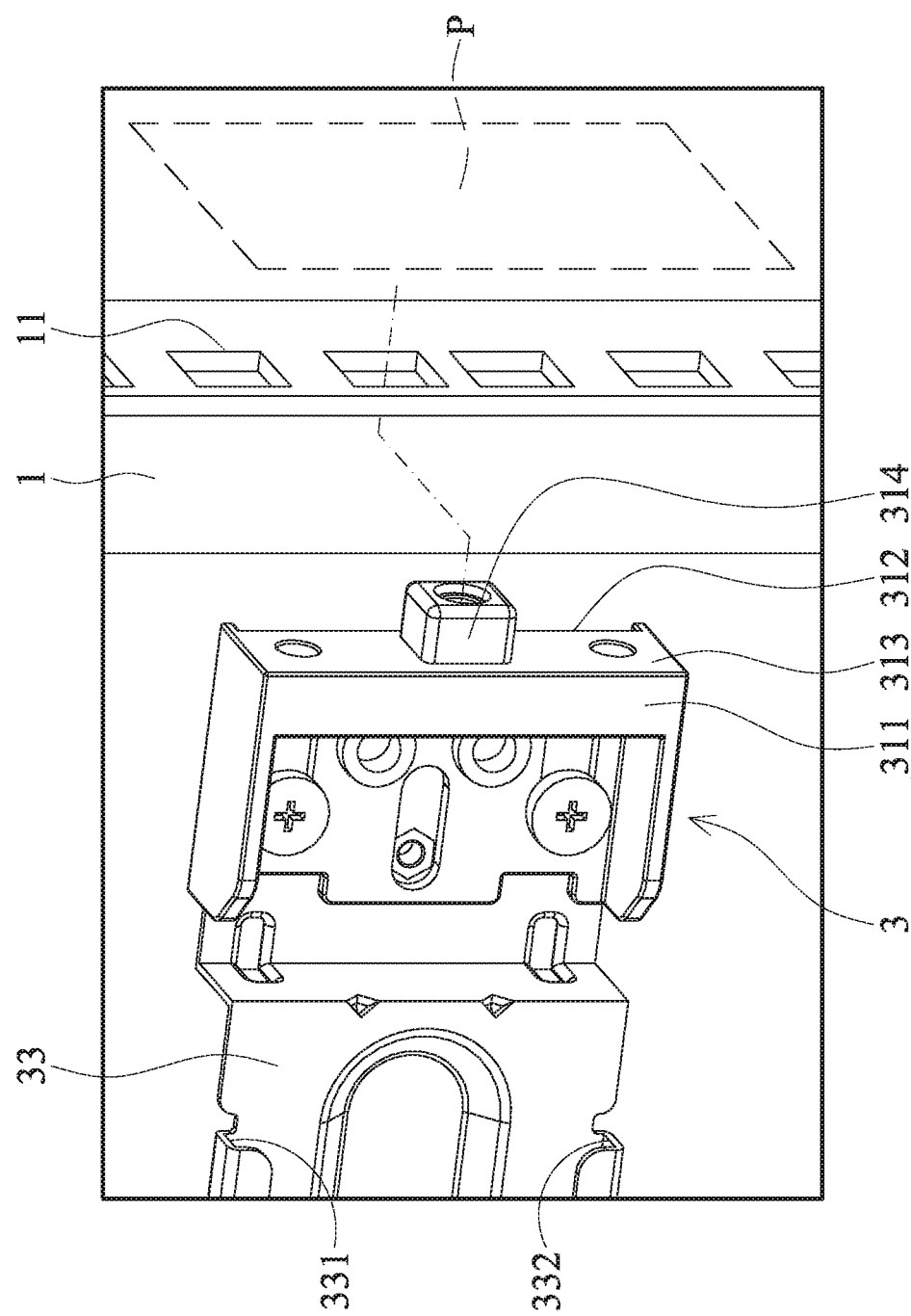
FIG. 2 shows the details of a track unit of the embodiment of the invention.

FIG. 2 shows the details of the track unit 3 of the embodiment of the invention. With reference to FIG. 2, in one embodiment, each track unit 3 comprises a first connection base 31 and a track portion 33. The first connection base 31 is disposed on one end of the track portion 33. The first connection base 31 comprises a first connection side 313, a first base side 311 and a second base side 312. The first connection side 313 is located between the first base side 311 and the second base side 312. The first connection side 313 is connected to the first pillar 1. On a projection P of the first connection side 313, the track portion 33 is located between the first base side 311 and the second base side 312.

With reference to FIG. 2, in one embodiment, when the device D is received in the cabinet R, the first base side 311 faces the device D, and the second base side 312 is opposite the first base side 311.

Figure 3:
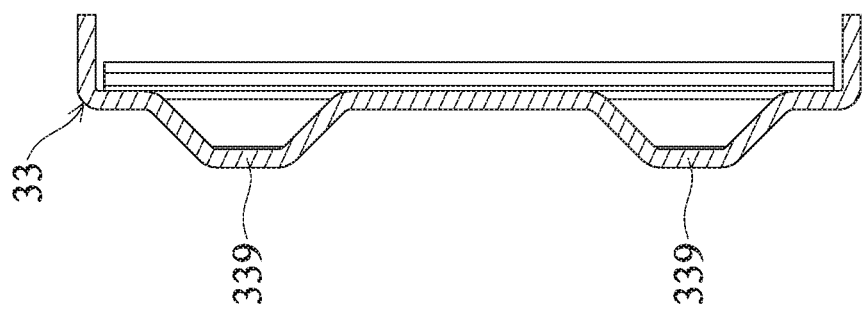
FIG. 3 shows enhancement ribs of the embodiment of the invention.

With reference to FIG. 3, in one embodiment, the track portion 33 comprises a plurality of enhancement ribs 339, and the enhancement ribs 339 are parallel to each other. The enhancement ribs 339 increase the structural strength of the track portion 33. In one embodiment, the thickness of the track portion 33 can be therefore reduced.

Figure 4A:
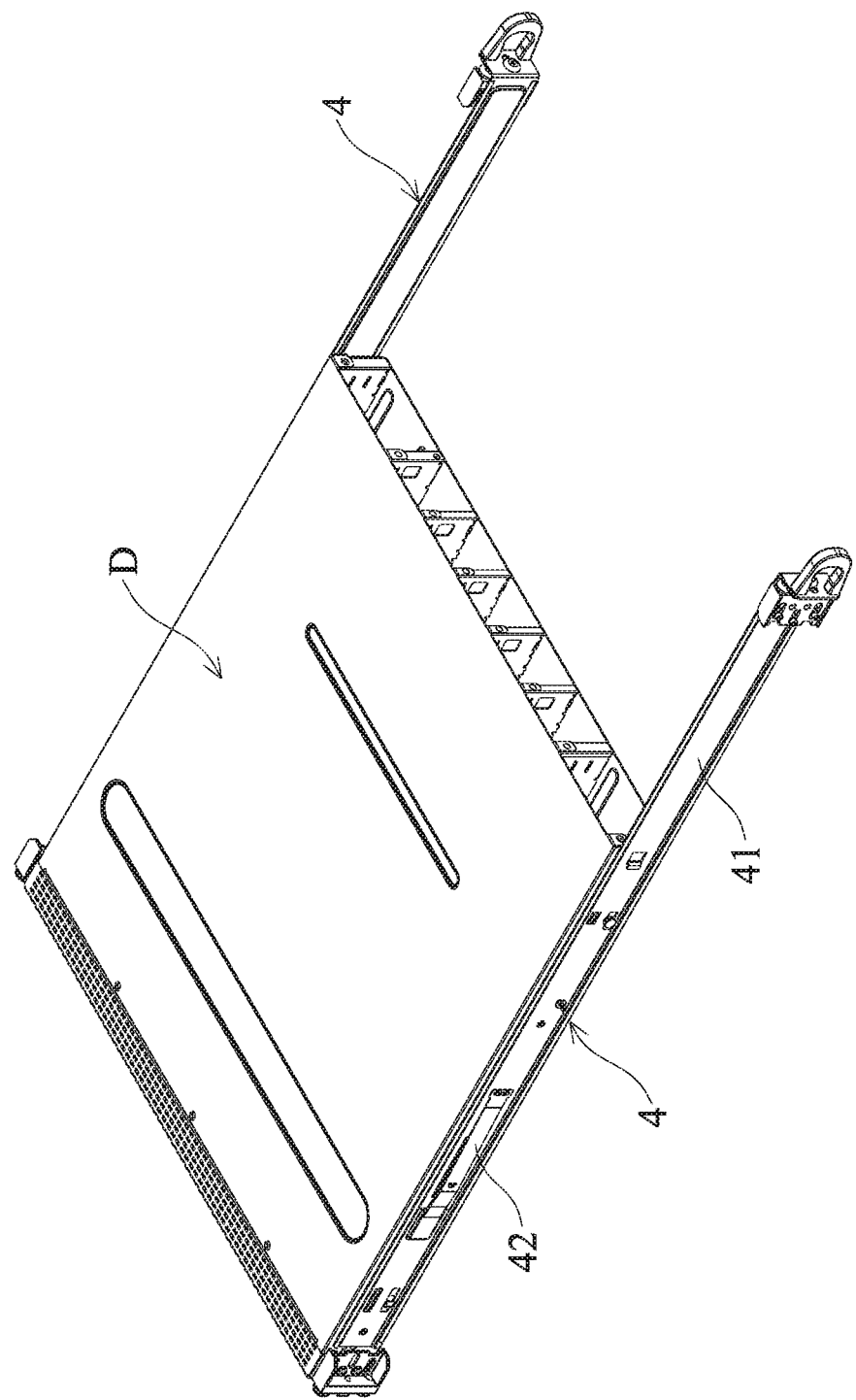
FIG. 4A shows a slider of the embodiment of the invention disposed on a device.
Figure 4B:
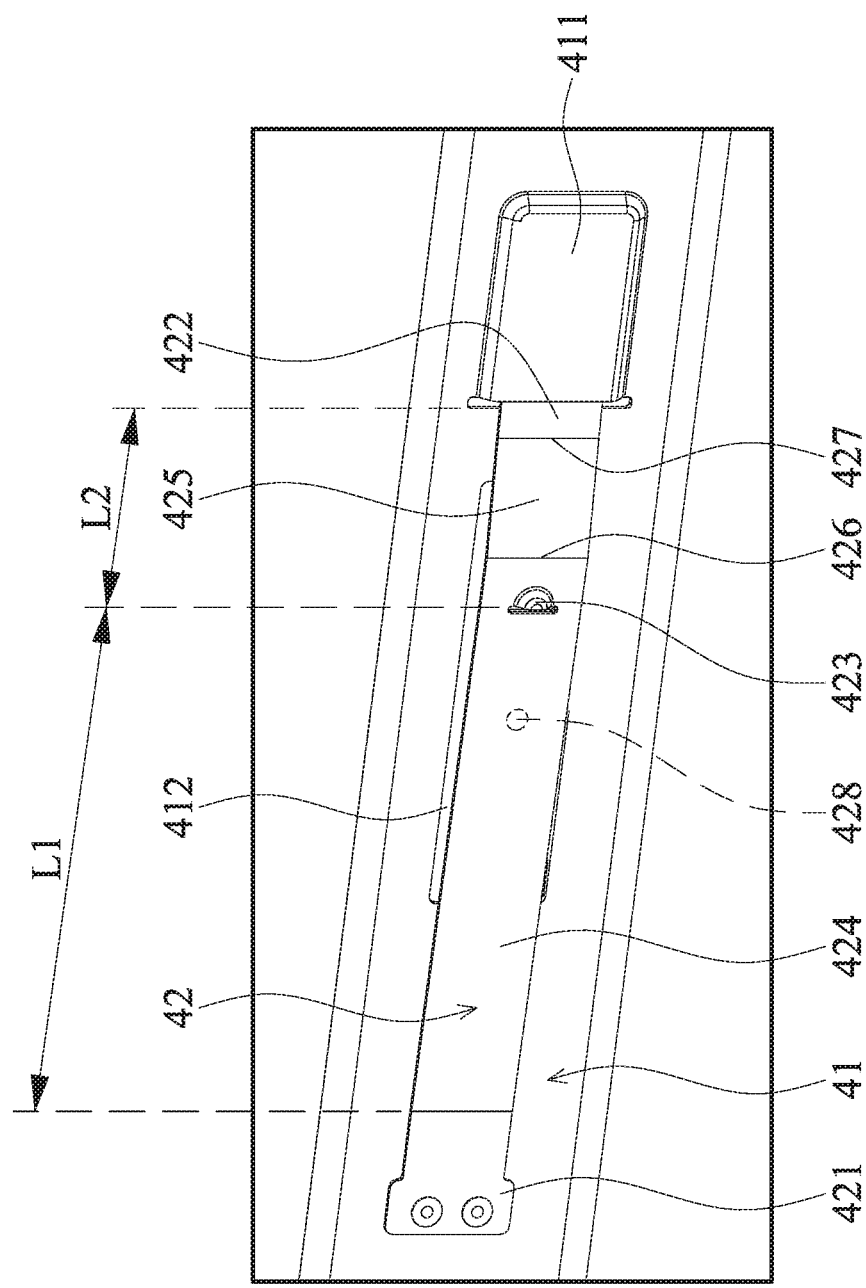
FIG. 4B shows the details of the slider of the embodiment of the invention.
Figure 4C:
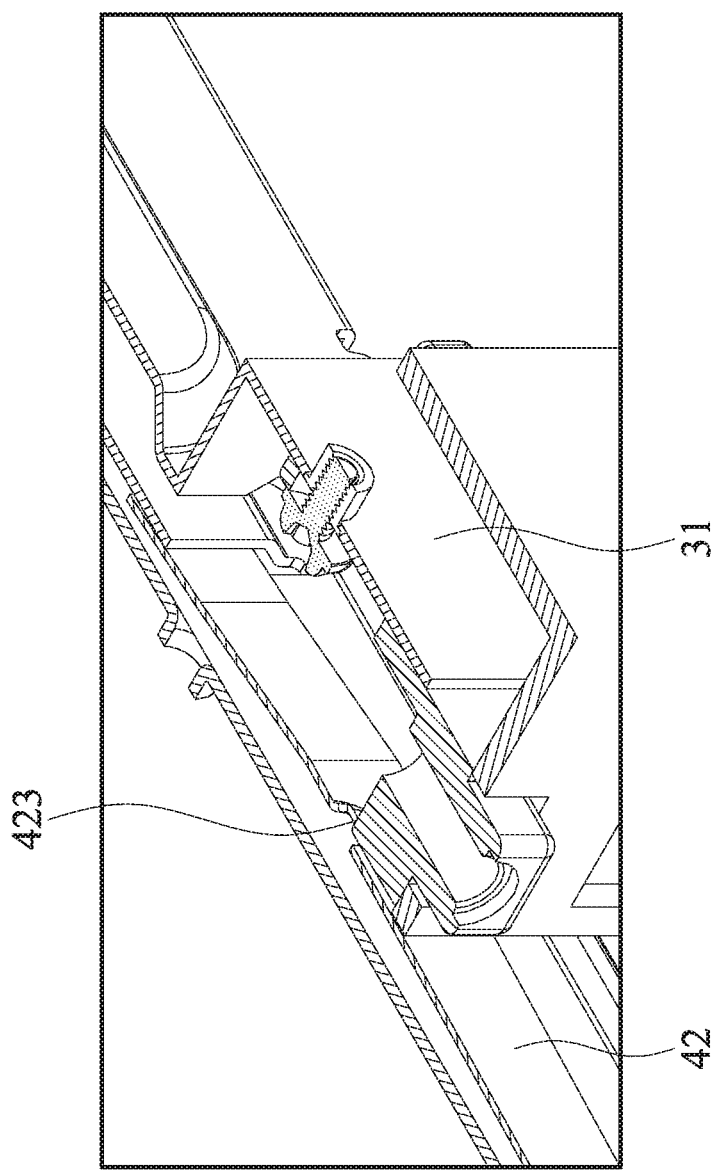
FIG. 4C shows the slider of the embodiment of the invention abutting a first connection base.

With reference to FIGS. 4A, 4B and 4C, in one embodiment, each slider 4 comprises a slider body 41 and an elastic arm 42. The elastic arm 42 is connected to the slider body 41, and the elastic arm 42 is adapted to abut the first connection base 31.

With reference to FIG. 4B, in one embodiment, a first end 421 of the elastic arm 42 is affixed to the slider body 41. A body slot 411 is formed on the slider body 41. A second end 422 of the elastic arm 42 is inserted into the body slot 411. An abutting protrusion 423 is formed on the elastic arm 42, and the abutting protrusion 423 is adapted to abut the first connection base 31 (with reference to FIG. 4C).

With reference to FIG. 4B, in one embodiment, the elastic arm 42 comprises a first elastic section 424 and a second elastic section 425. The first elastic section 424 is located between the first end 421 and the abutting protrusion 423. The second elastic section 425 is located between the second end 422 and the abutting protrusion 423. The length of the first elastic section 424 is greater than the length of the second elastic section 425.

With reference to FIG. 4B, in one embodiment, when the ratio of the length L1 of the first elastic section 424 to the length L2 of the second elastic section 425 is between 1~2.33, the slider 4 provides improved operation feel to user.

With reference to FIG. 4B, in one embodiment, the second elastic section 425 comprises a first bent portion 426 and a second bent portion 427. The first bent portion 426 is located between the second bent portion 427 and the abutting protrusion 426. The second bent portion 427 is located between the first bent portion 426 and the second end 422. In this embodiment, the bending direction of the first bent portion 426 is opposite the bending direction of the second bent portion 427.

With reference to FIG. 4B, in one embodiment, the slider body 41 comprises a body opening 412. The body opening 412 corresponds to the abutting protrusion 423. In this embodiment, the elastic arm 42 further has a pressing point 428, the pressing point 428 is located on the first elastic section 424.

With reference to FIG. 2, in one embodiment, the first connection base 31 comprises a first wedging protrusion 314. The first pillar 1 comprises a plurality of first wedging holes 11. The first wedging protrusion 314 is adapted to be wedged into one of the first wedging holes 11.

Figure 5A:
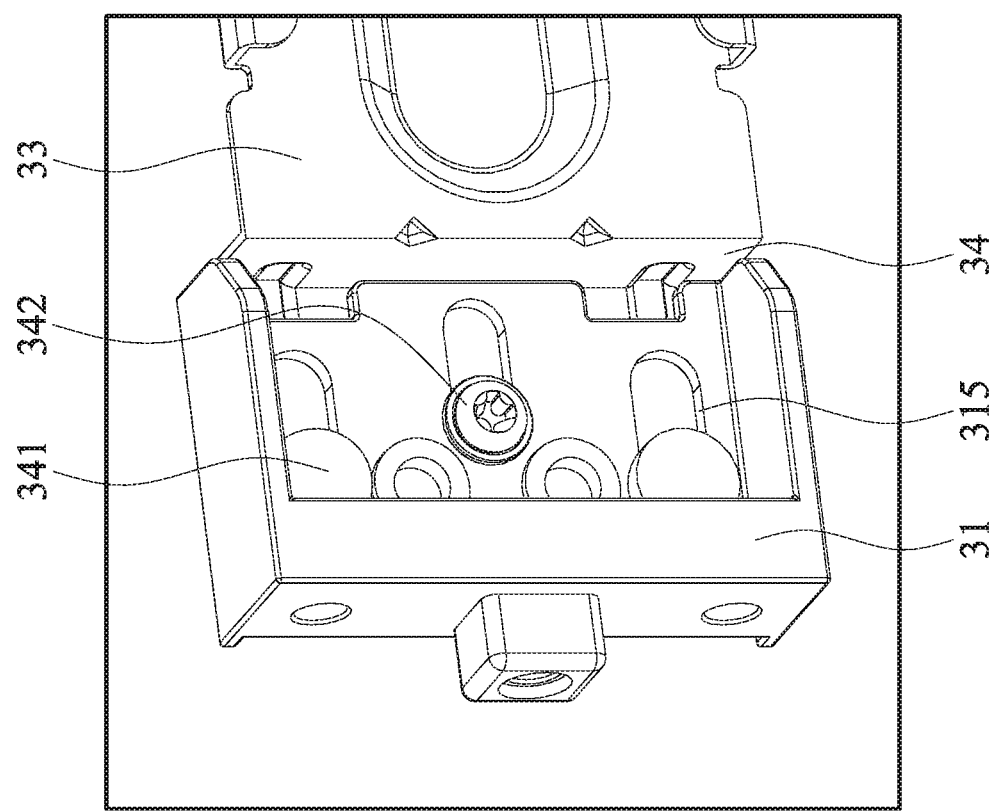
FIGS. 5A, 5B and 5C show the details of the first connection base of an embodiment of the invention.
Figure 5B:
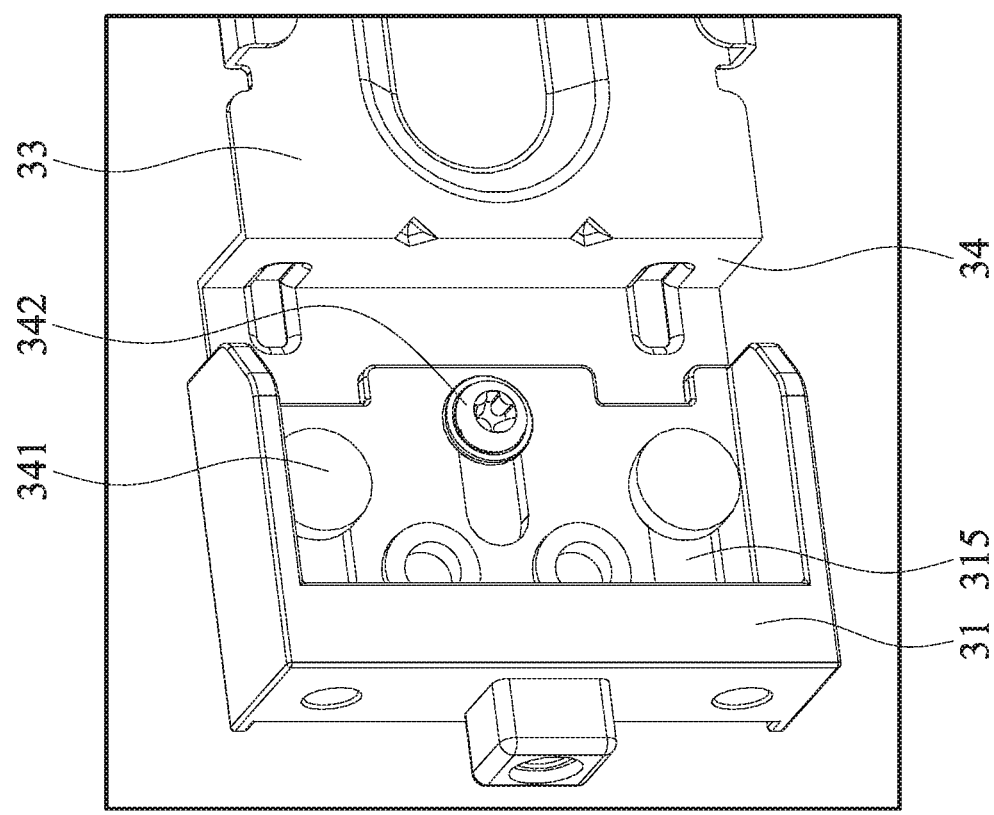
Figure 5C:
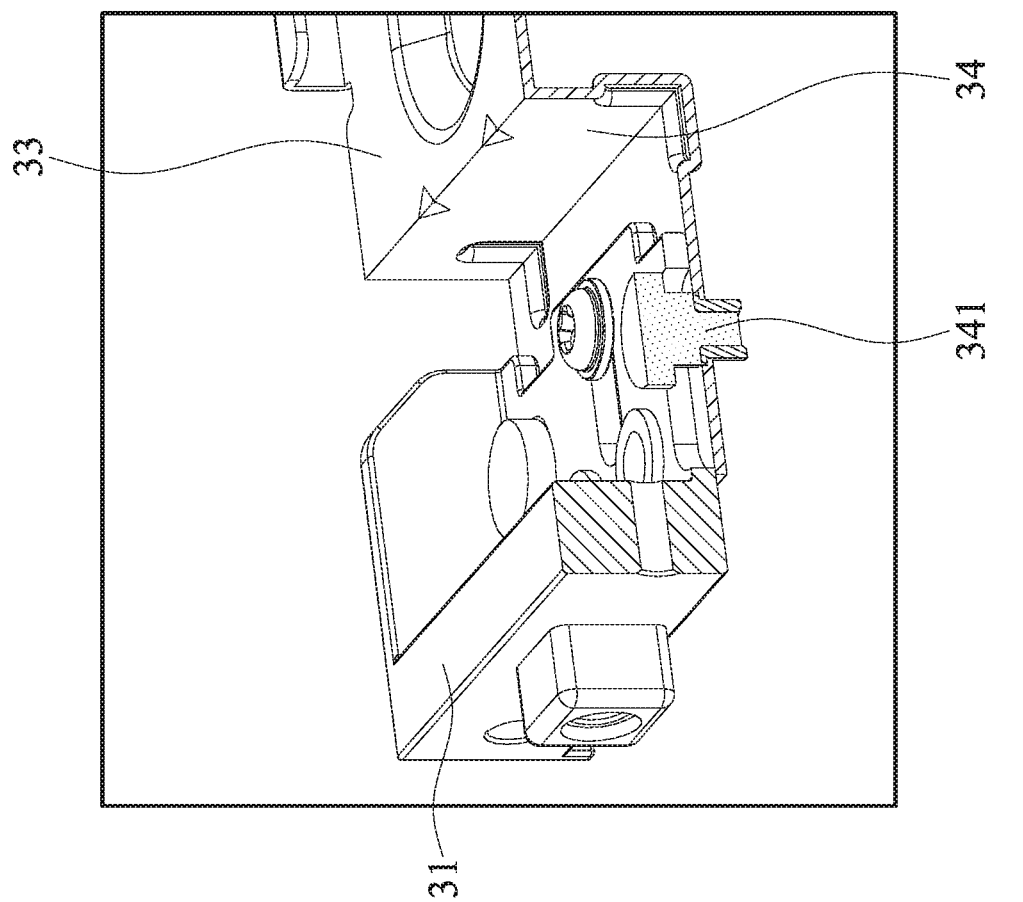

With reference to FIGS. 5A, 5B and 5C, in one embodiment, the first connection base 31 is slidably connected to the track portion 33. In this embodiment, each track unit 3 comprises a plurality of latches 341. The first connection base 31 comprises a plurality of base slots 315. Each latch 341 passes through one of the base slots 315 to be affixed to the track portion 33. The latches 341 are adapted to abut the first connection base 31. With reference to FIG. 5C, in one embodiment, the cross section of the latch 341 can be T-shaped. In one embodiment, each track unit 3 comprises a track bolt 342. The track bolt 342 is affixed to a relative position between the first connection base 31 and the track portion 33. In this embodiment, the track unit 3 further comprises an extension portion 34. The cross section of the extension portion 34 is L-shaped. The extension portion 34 is connected to one end of the track portion 33. The latch 341 and the track bolt 342 are disposed on the extension portion 34.

Figure 6A:
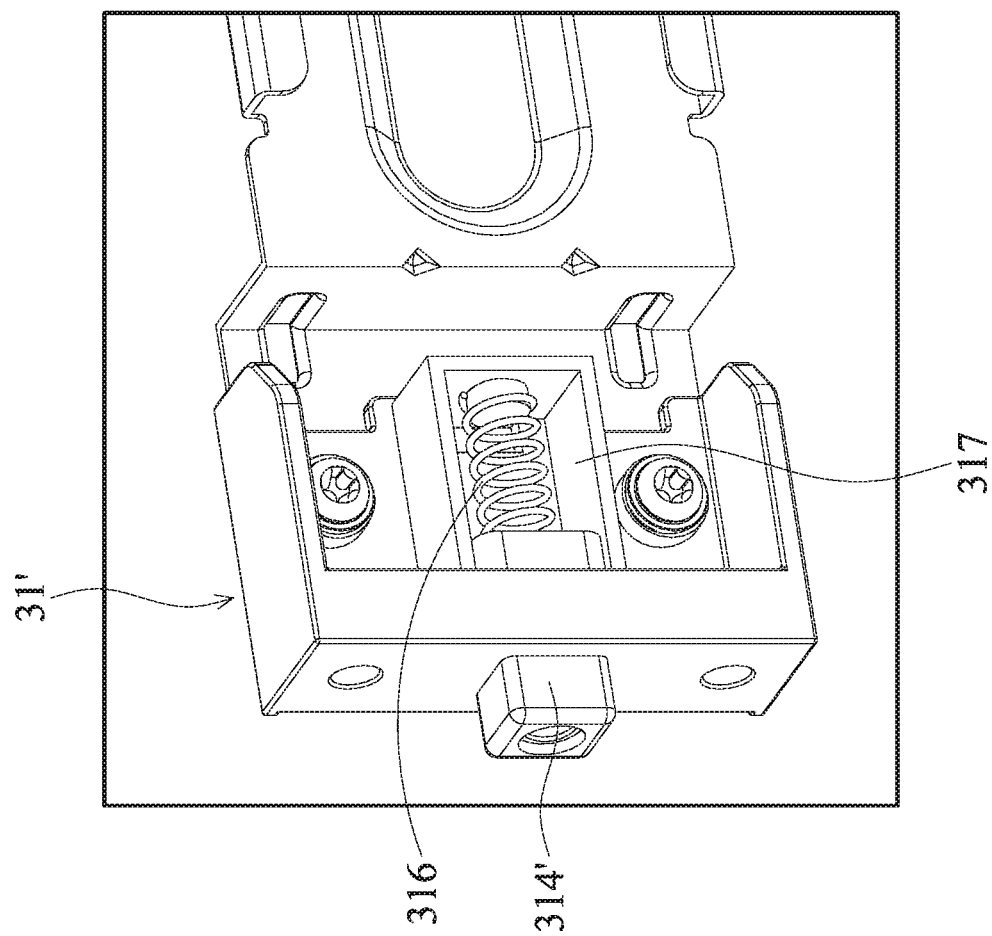
FIGS. 6A and 6B show the details of the first connection base of another embodiment of the invention.
Figure 6B:
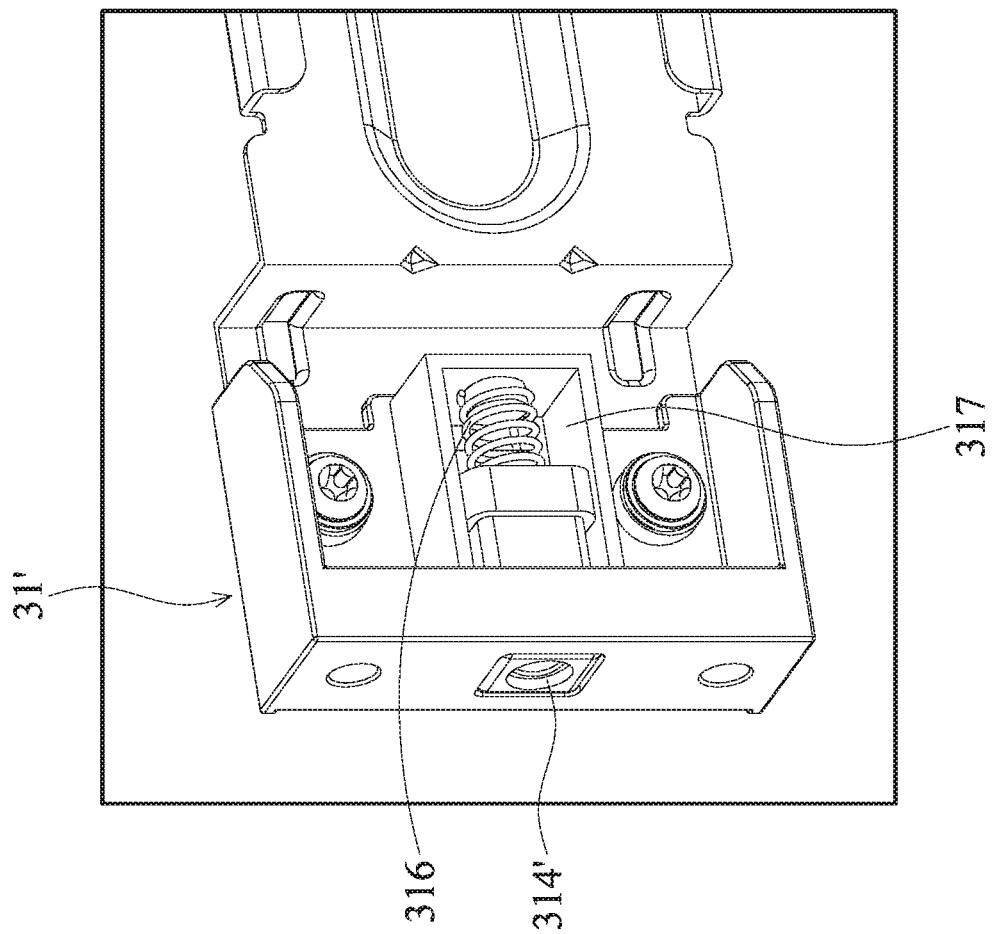

With reference to FIGS. 6A and 6B, in another embodiment, the first connection base 31' comprises a spring 316 and a receiving recess 317. The spring 316 is disposed in the receiving recess 317. One end of the spring 316 abuts an inner wall of the receiving recess 317. The other end of the spring 316 abuts the first wedging protrusion 314'. The first wedging protrusion 314' is adapted to be moved between a first protrusion position (FIG. 6A) and a second protrusion position (FIG. 6B).

Figure 7:
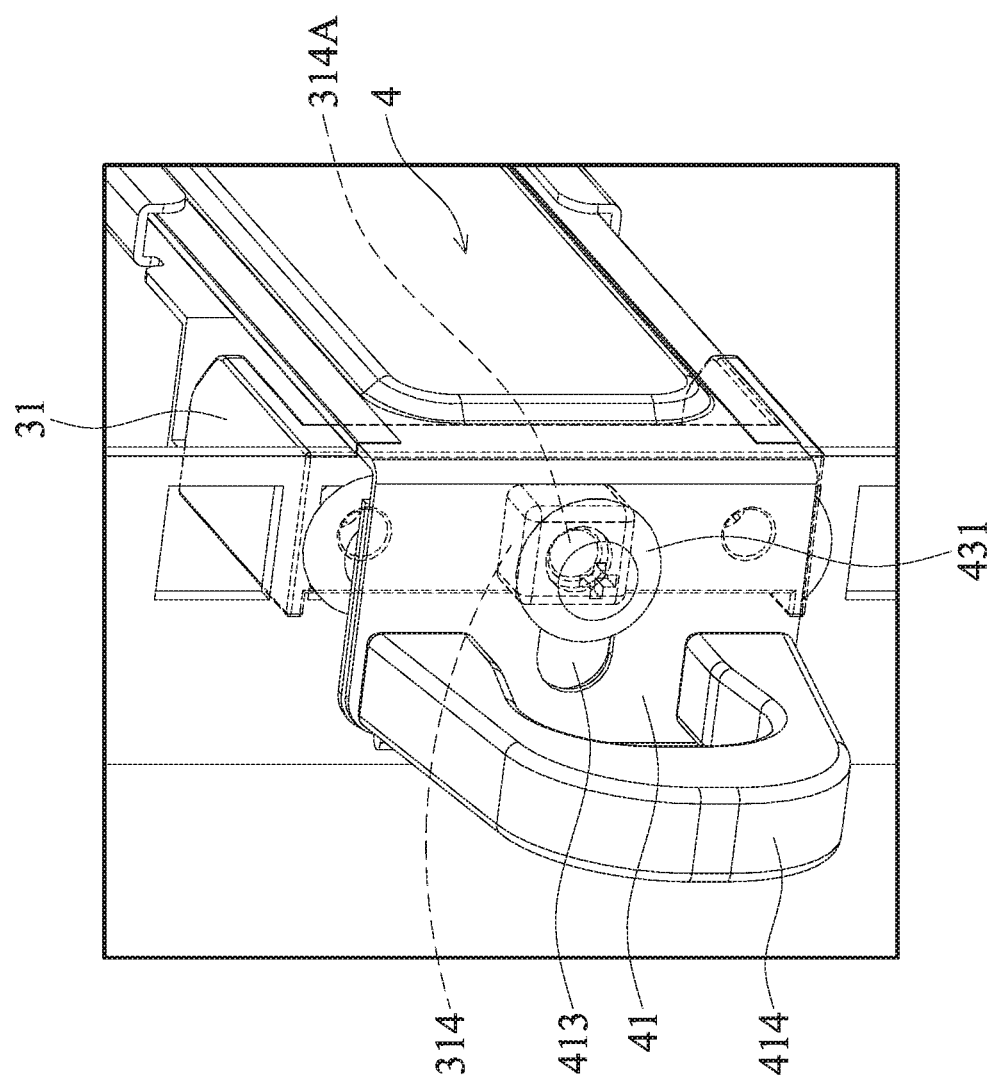
FIG. 7 shows a handle of the embodiment of the invention.

With reference to FIG. 7, in one embodiment, the slider 4 comprises a slider bolt 431. The slider body 41 comprises a body fastening hole 413. The first wedging protrusion 314 comprises a first protrusion thread hole 314A. The slider bolt 431 passes through the body fastening hole 413 to be connected to the first protrusion thread hole 314A. The slider bolt 431 affixes the slider body 41 to the first wedging protrusion 314. In this embodiment, the slider 4 further has a handle 414, the handle 414 is convenient to user for draw out the device D.

Figure 8A:
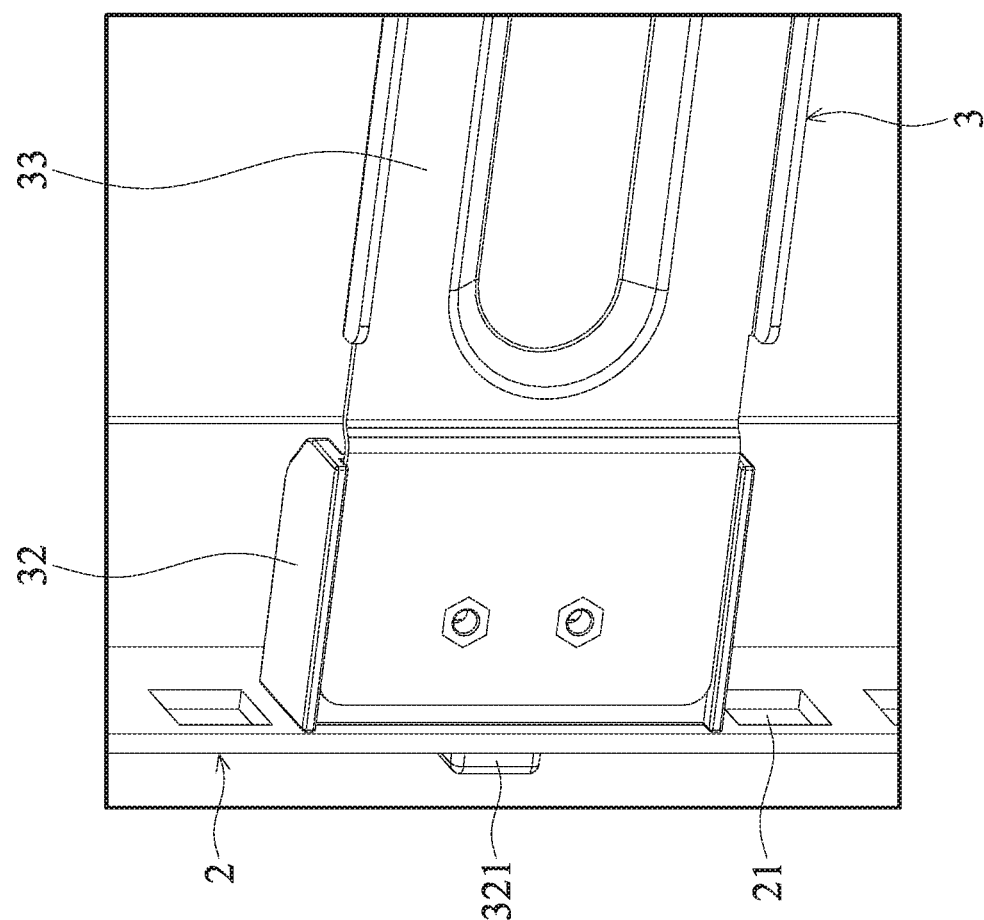
FIGS. 8A and 8B show a second connection base of the embodiment of the invention.
Figure 8B:
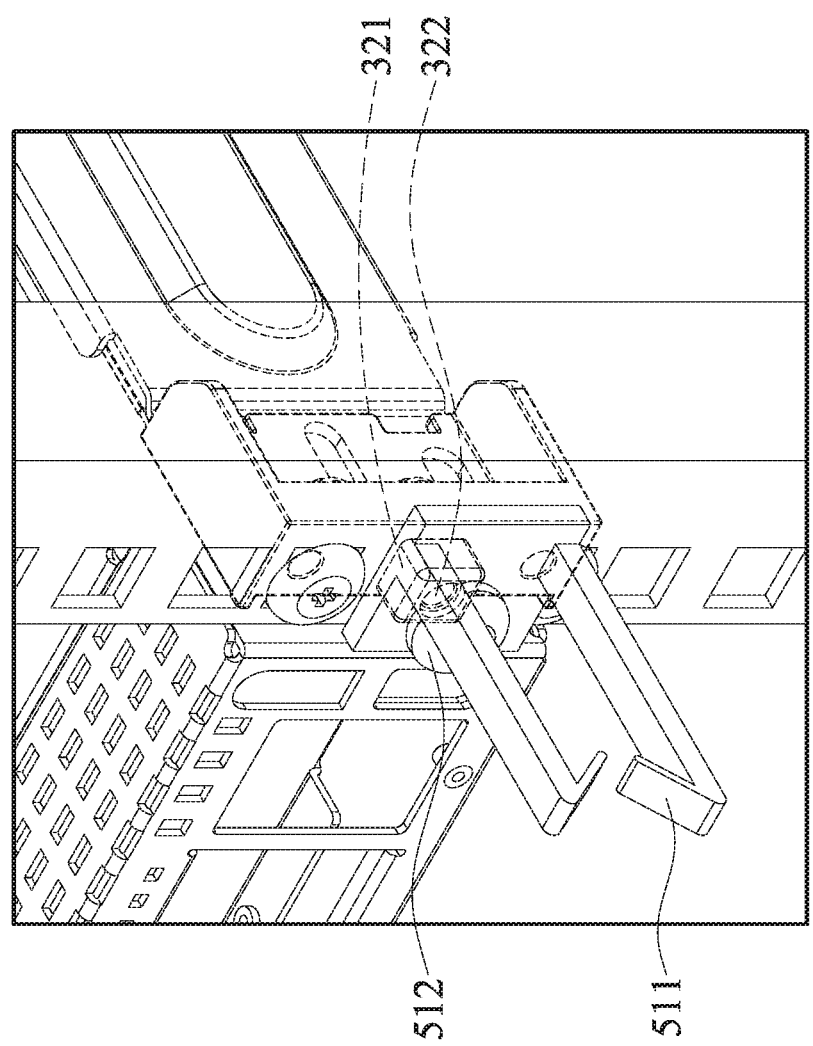

With reference to FIGS. 8A and 8B, in one embodiment, each track unit 3 further comprises a second connection base 32. The second connection base 32 is disposed on the other end of the track portion 33. The second connection base 32 comprises a second wedging protrusion 321. The second pillar 2 comprises a plurality of second wedging holes 21. The second wedging protrusion 312 is adapted to be wedged into one of the second wedging holes 21. The second wedging protrusion 321 comprises a second protrusion thread hole 322. The cabinet R further comprises a management rack 511 and a rack bolt 512. The rack bolt 512 is connected to the second protrusion thread hole 322 to affix the management rack 511 to the second wedging protrusion 321.

With reference to FIG. 2, in one embodiment, the track portion 33 comprises a first track 331 and a second track 332. The first track 331 faces the second track 332. The slider 4 is partially inserted into the first track 331 and the second track 332 and sliding along the first track 331 and the second track 332. On the projection P of the first connection side 313, the first track 331 and the second track 332 are entirely located between the first base side 311 and the second base side 312.

Utilizing the cabinet of the embodiment of the invention, the track portion is located between the first base side and the second base side on the projection of the first connection side. Therefore, the space between the first pillar and the second pillar can be sufficiently used. The device with increased width can be received between the first pillars and the second pillars. Particularly, the size of the slider of the embodiment of the invention is reduced, and the slider of the embodiment of the invention provides slide track function in limited space. Additionally, in the embodiment of the invention, the wedging protrusion can be moved relative to the track portion. The device can be drawn out from the cabinet independently to be repaired, and be reassembled into the cabinet easily.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A cabinet, adapted to receive a device, comprising:
   a plurality of first pillars;
   a plurality of second pillars;
   a plurality of track units, wherein each track unit is bridged between one of the first pillars and one of the second pillars;
   two sliders, disposed on two sides of the device, wherein the sliders are slidably connected to the track units,
   wherein each track unit comprises a first connection base and a track portion, the first connection base is disposed on one end of the track portion, the first connection base comprises a first connection side, a first base side and a second base side, the first connection side is located between the first base side and the second base side, the first connection side is connected to the first pillar, and on a projection of the first connection side, the track portion is located between the first base side and the second base side,
   wherein when the device is received in the cabinet, the first base side faces the device, and the second base side is opposite the first base side, wherein each slider comprises a slider body and an elastic arm, the elastic arm is connected to the slider body, and the elastic arm is adapted to abut the first connection base, wherein a first end of the elastic arm is affixed to the slider body, a body slot is formed on the slider body, a second end of the elastic arm is inserted into the body slot, an abutting protrusion is formed on the elastic arm, and the abutting protrusion is adapted to abut the first connection base, wherein the elastic arm comprises a first elastic section and a second elastic section, the first elastic section is located between the first end and the abutting protrusion, the second elastic section is located between the second end and the abutting protrusion, and a length of the first elastic section is greater than a length of the second elastic section, and wherein the second elastic section comprises a first bent portion and a second bent portion, the first bent portion is located between the second bent portion and the abutting protrusion, and the second bent portion is located between the first bent portion and the second end.

2. The cabinet as claimed in claim 1, wherein the track portion comprises a plurality of enhancement ribs, and the enhancement ribs are parallel to each other.

3. The cabinet as claimed in claim 1, wherein a ratio of the length of the first elastic section to the length of the second elastic section is between 1~2.33.

4. The cabinet as claimed in claim 1, wherein the slider body comprises a body opening, and the body opening corresponds to the abutting protrusion.

5. The cabinet as claimed in claim 1, wherein the first connection base comprises a first wedging protrusion, the first pillar comprises a plurality of first wedging holes, and the first wedging protrusion is adapted to be wedged into one of the first wedging holes.

6. The cabinet as claimed in claim 5, wherein the first connection base is slidably connected to the track portion.

7. The cabinet as claimed in claim 6, wherein each track unit comprises a plurality of latches, the first connection base comprises a plurality of base slots, each latch passes through one of the base slots to be affixed to the track portion, and the latches are adapted to abut the first connection base.

8. The cabinet as claimed in claim 7, wherein each track unit comprises a track bolt, and the track bolt is affixed to a relative position between the first connection base and the track portion.

9. The cabinet as claimed in claim 5, wherein the first connection base comprises a spring and a receiving recess, the spring is disposed in the receiving recess, one end of the spring abuts an inner wall of the receiving recess, the other end of the spring abuts the first wedging protrusion, and the first wedging protrusion is adapted to be moved between a first protrusion position and a second protrusion position.

10. The cabinet as claimed in claim 5, wherein the slider comprises a slider bolt, the slider body comprises a body fastening hole, the first wedging protrusion comprises a first protrusion thread hole, the slider bolt passes through the body fastening hole to be connected to the first protrusion thread hole, and the slider bolt affixes the slider body to the first wedging protrusion.

11. The cabinet as claimed in claim 1, wherein each track unit further comprises a second connection base, the second connection base is disposed on the other end of the track portion, the second connection base comprises a second wedging protrusion, the second pillar comprises a plurality of second wedging holes, the second wedging protrusion is adapted to be wedged into one of the second wedging holes, the second wedging protrusion comprises a second protrusion thread hole, the cabinet further comprises a management rack and a rack bolt, and the rack bolt is connected to the second protrusion thread hole to affix the management rack to the second wedging protrusion.

12. The cabinet as claimed in claim 1, wherein the track portion comprises a first track and a second track, the first track faces the second track, the slider is partially inserted into the first track and the second track, the slider slides along the first track and the second track, and on the projection of the first connection side, the first track and the second track are entirely located between the first base side and the second base side.

* * * * *